United States Patent
Merchant et al.

(10) Patent No.: US 6,524,957 B2
(45) Date of Patent: Feb. 25, 2003

(54) METHOD OF FORMING IN-SITU ELECTROPLATED OXIDE PASSIVATING FILM FOR CORROSION INHIBITION

(75) Inventors: Sailesh Mansinh Merchant, Orlando, FL (US); Sudhanshu Misra, Orlando, FL (US); Pradip Kumar Roy, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/953,706

(22) Filed: Sep. 17, 2001

(65) Prior Publication Data

US 2002/0030282 A1 Mar. 14, 2002

Related U.S. Application Data

(62) Division of application No. 09/385,716, filed on Aug. 30, 1999, now abandoned.

(51) Int. Cl.[7] ................................................ H01L 21/44
(52) U.S. Cl. ...................... 438/687; 438/626; 438/629; 438/635; 438/637; 438/672
(58) Field of Search ................................ 438/687, 618, 438/626, 629, 633, 635, 637–640, 668, 672–675

(56) References Cited

U.S. PATENT DOCUMENTS

| | | | |
|---|---|---|---|
| 5,021,129 A | 6/1991 | Arbach et al. | |
| 5,539,256 A | 7/1996 | Mikagi | |
| 5,783,489 A | 7/1998 | Kaufman et al. | |
| 5,817,572 A | 10/1998 | Chiang et al. | |
| 5,891,205 A | 4/1999 | Picardi et al. | |
| 5,893,752 A | 4/1999 | Zhang et al. | |
| 5,897,375 A | 4/1999 | Watts et al. | |
| 5,913,144 A | 6/1999 | Nguyen et al. | |
| 6,100,190 A | * 8/2000 | Kobori | 438/622 |
| 6,111,301 A | 8/2000 | Stamper | |
| 6,147,000 A | * 11/2000 | You et al. | 438/626 |
| 6,172,421 B1 | * 1/2001 | Besser et al. | 257/647 |
| 6,228,767 B1 | 5/2001 | Yakura | |
| 6,303,505 B1 | * 10/2001 | Ngo et al. | 438/626 |
| 6,309,970 B1 | * 10/2001 | Ito et al. | 438/618 |

\* cited by examiner

Primary Examiner—Chandra Chaudhari
Assistant Examiner—Thanh Nguyen
(74) Attorney, Agent, or Firm—Sutherland Asbill & Brennan LLP

(57) ABSTRACT

A method an apparatus for making copper metallic interconnects for semiconductors having an oxide layer deposited in the copper in situ during the deposition of the copper within the via.

9 Claims, 3 Drawing Sheets

METHOD OF FORMING IN-SITU ELECTROPLATED OXIDE PASSIVATING FILM FOR CORROSION INHIBITION

CROSS-REFERENCE TO RELATED APPLICATIONS

This application is a divisional of U.S. patent application Ser. No. 09/385,716, filed Aug. 30, 1999 now abandoned, which is hereby incorporated by reference herein in its entirety.

FIELD OF THE INVENTION

The present invention relates generally to semiconducting manufacturing, and more particularly to deposition of copper for integrated circuit interconnects.

BACKGROUND OF THE INVENTION

In the field of semiconductors, the materials used to make interconnects and fill the windows, or vias, must have both low resistivity and the ability to withstand volatile process environments. Aluminum and tungsten materials are often used in the production of ICs for making interconnections or vias between electrically active areas. These metals are popular because they are easy to use in a production environment, unlike copper which requires special handling. The integrated circuit (IC) industry is currently researching and developing new metallic interconnect materials and structures that can be used with integrated circuits. One promising material for use in IC interconnects is copper.

Copper is a natural choice to replace aluminum in the effort to reduce size of lines and vias in an electrical circuit. The conductivity of copper is approximately twice that of aluminum and over three times that of tungsten. As a result, the same circuit can be carried through a copper line having half the width of the aluminum line. The electro-migration characteristics of copper also are superior to aluminum. Copper is approximately ten times better than aluminum with respect to electromigration. Therefore, a copper line having a smaller cross-section than an aluminum counterpart would still be better able to maintain electrical integrity.

However, processing limitations with regard to copper must be solved before copper replaces aluminum in IC technology. For example, copper pollutes many materials used in IC processes and, therefore, more care must be taken to keep copper from migrating. The migration of copper into silicon semiconductor regions is especially harmful to optimum semiconductor performance and useful life. The conductive characteristics of the semiconductor regions are a consideration in the design of transistors. Typically, the fabrication process is carefully controlled to produce semiconductor regions in accordance with the design. Elements of copper migrating into the semiconductor regions can dramatically alter the conductive characteristic of the associated product. Various methods have been suggested to deal with the problem of copper diffusion into integrated circuit materials. Several materials, especially metallic materials, such as molybdenum and titanium nitride, have been suggested for use as barriers to prevent copper diffusion problems.

Further, there is currently no known technology which can plasma etch or wet etch copper materials. However, functional copper interconnects must be adequately provided over the surface of an integrated circuit. To overcome this limitation, copper chemical mechanical polishing (CMP) is one promising alternative that may facilitate the use of copper in the IC industry.

A further problem with copper relates to its willingness to oxidize and otherwise corrode to a much greater degree than its aluminum counterpart. To delay or control this oxidation, a thin layer of oxide has been placed at the surface of the copper plugs that are deposited within a via. To provide a clean and uniform copper surface, CMP processes are then used to remove the oxide layer. However, problems have surfaced with regard to the uniformity of the finished surface layers since precise removal of layers, such as an oxide layer, from a softer material, such as copper, presents special difficulties. In other words, the CMP processes currently contemplated for use with copper technology does not allow for the uniform removal of an oxide surface layer. In any event, the deposition of an oxide layer after the copper deposition results in an additional, time-consuming process step for the manufacture of copper interconnects.

SUMMARY OF THE INVENTION

The present invention is therefore directed to a method of providing an oxide layer in situ during the deposition of a copper-containing layer. One preferred embodiment is directed to a method of forming a semiconductor by providing a substrate having a metallic interconnect. A dielectric layer is formed on the substrate. Vias are etched or otherwise machined into the semiconductor to establish interconnects. Copper is deposited into the via such that an oxide layer is codeposited within the copper in the via in situ. An additional amount of copper is then deposited to cover the oxide layer. Optional barrier layers and other compatibilizing layers may be deposited into the vias prior to depositing the copper plug.

A further embodiment of the present invention is directed to a semiconductor comprising copper interconnects having oxide layers deposited within the copper in situ.

In a still further embodiment, the present invention is directed to a semiconductor comprising a substrate with a dielectric layer formed on the substrate. Vias are formed in the dielectric layer and made to extend through the dielectric layer. Optionally, barrier layers coat the walls and floor of the via followed by the deposition a copper-containing material into the via, with at least one oxide layer formed in the copper layer in situ. Additional copper is then deposited to cover the oxide layer.

BRIEF DESCRIPTION OF THE DRAWINGS

The present invention is illustrated by way of example and not limitation in the accompanying figures, in which like references indicate similar elements, and in which.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
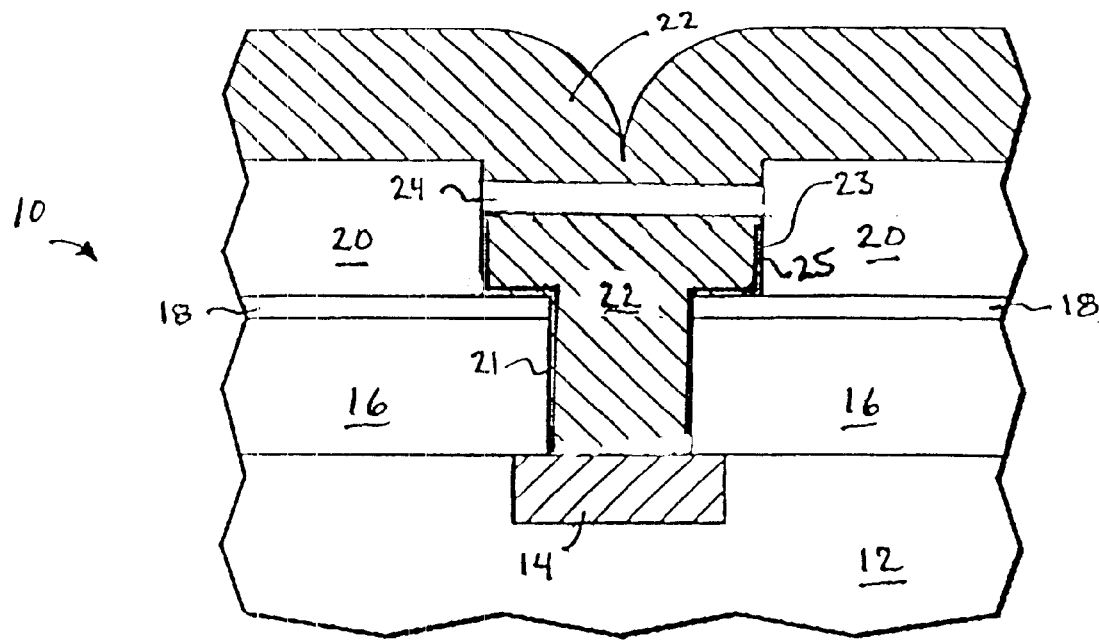
FIG. 1 is a cross-sectional representation of an integrated circuit having an oxide layer in situ within the copper layer.

FIG. 1 shows a semiconductor structure 10 having a substrate 12. The substrate 12 has a base that is typically a crystalline silicon wafer. However, other semiconductor substrates can be used such as germanium, gallium arsenide, germanium silicon, silicon-on-insulator (SOI) substrates, silicon carbide substrates, epitaxial layers, polysilicon substrate, and the like, as is well-known to those skilled in the field of semiconductor design and construction. A layer 14 may be included in typical constructions and is a semi-conductive or metallic conductor. Metal interconnects include materials such as aluminum, aluminum alloys, copper, gold, silver, conductive oxides, and combinations thereof. A low-k dielectric layer 16 is then deposited followed by an optional etch stop layer 18. The low-k dielectric may be borophosphosilicate glass, a tetraorthosilicate (TEOS), a fluorinated TEOS, polymer materials, plasma enhanced TEOS, and combinations thereof. The low-k layer is deposited to a thickness of from about 2000 Å to about 8000 Å by either chemical vapor deposition, spin-on or sol-gel technique as would be readily understood by one skilled in the field of integrated circuit manufacture. The etch stop layer is typically formed from a plasma enhanced nitride, a silicon oxynitride, or composites thereof A dielectric layer 20 is then formed over the etch stop layer 18. The material composition of this layer 20 may be similar to layer 16. Known photolithographic processing is then used to etch a via 21 through the layer 16 and a trench interconnect opening through layer 20. A conductive layer 22, in this case copper, is deposited into the via 21. According to the present invention an oxide layer 24 is deposited in situ within the copper layer 22, followed by depositing a further covering of copper 22.

Although not shown in FIG. 1, the formation of the copper plug 22 in the via 21 begins by forming a thin barrier layer along the walls of the via, and exposed conductor 14 surface, to protect the dielectric layer from electromigration of the metal plug or other deposited metal layers. The barrier layer may be tantalum nitride, titanium nitride, titanium tungsten, tantalum, titanium, zirconium, hafnium, molybdenum, tantalum silicon nitride, tungsten nitride, alloys of these materials and combinations thereof. The barrier layer is desirably very thin, typically no greater than from about 20 Å to about 400 Å. The barrier layer is deposited to insure that the deposited copper is properly contained within the via and will not migrate into the porous dielectric materials and contaminate the silicon-containing layers.

After the barrier layer and other optional layers, if desired, (not shown) are formed, a CVD process is used to deposit a layer of copper-containing metal (also not shown) to act as an interface layer between the barrier layer and the copper. This layer is typically deposited to a thickness of from about 1000 to about 3000 Å and assists in the good adherence of the copper plug within the via. The CVD copper layer may be replaced by an ionized metal plasma (IMP) layer of copper or copper alloy. The formation of this seed layer may also be performed using a collimated physical vapor deposition (PVD) process.

Figure 2:
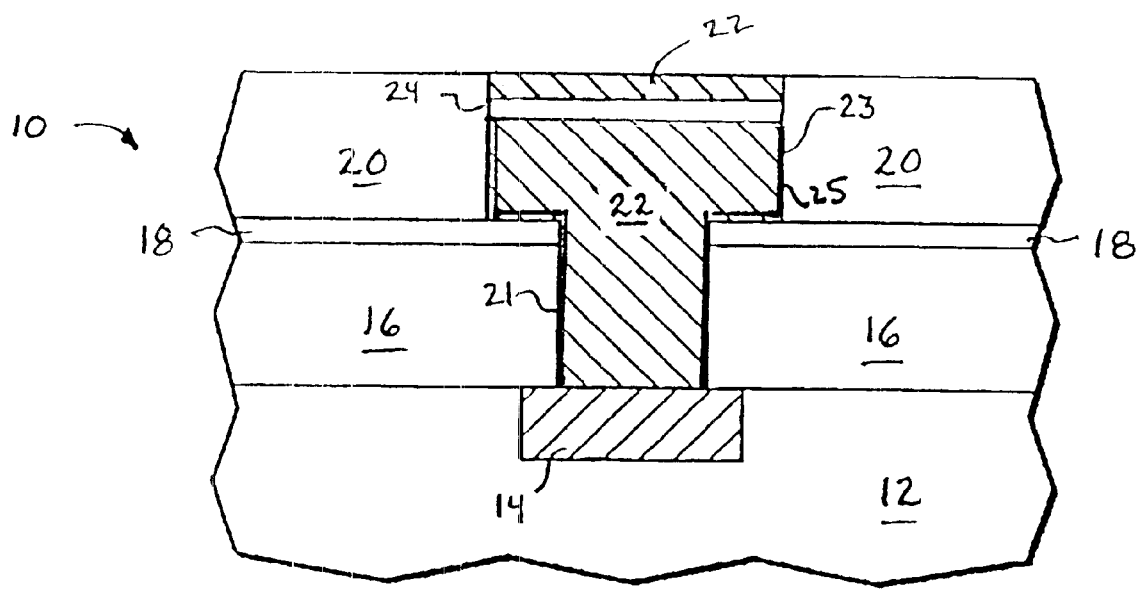
FIG. 2 is a cross-sectional representation of the integrated circuit of FIG. 1 after CMP processing.
Figure 3:
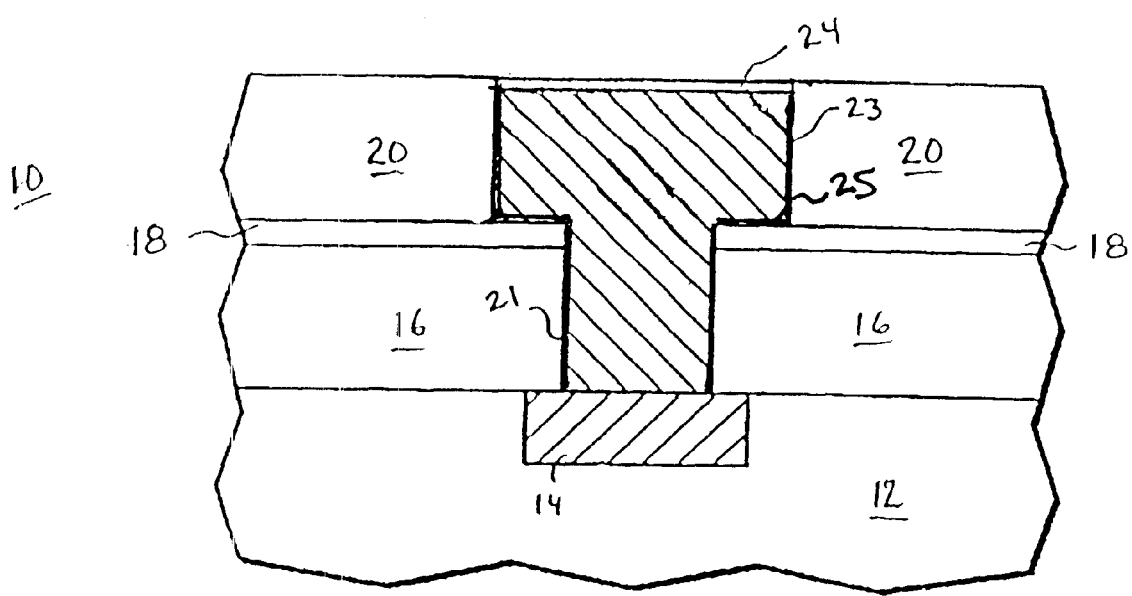
FIG. 3 is a cross-sectional representation of an integrated circuit showing the copper-filled via with a protective oxide layer at the surface.

Other deposition methods such as low pressure CVD, plasma enhanced CVD, physical vapor CVD, electroless plating, sputtering, and the like may be used to form the various layers described herein. As shown in FIGS. 2 and 3, the copper layer 22 may be machined flush with the top of the dielectric layer 20 to form the interconnect. A CMP tool is then used to machine the top of the copper layer to a desired surface. Further, the dielectric layer 20 itself may be machined to expose the oxide layer 24. According to the CMP process, a CMP polishing pad is placed into physical contact with an applied slurry and is mechanically rotated with pressure applied to effect a chemical/mechanical removal of upper portions of the surface layer to a desired extent. The process can detect variances in material resistance allowing the operator to detect when various layers have been reached. Since the oxide layer 24 is a harder material than is the copper 22, the operator can detect when the CMP process has reached or even passed through the oxide layer. In this way, the oxide layer deposited in situ with the copper layer acts as a polish rate modulator during CMP.

The slurry can contain an oxidizing agent such as a carboxylate salt, an abrasive slurry, a solvent, and an optional triazole or triazole derivative. The incorporation of hydrogen peroxide is often desirable. Silica and alumina are useful abrasives and have shown good copper removal.

Figure 4:
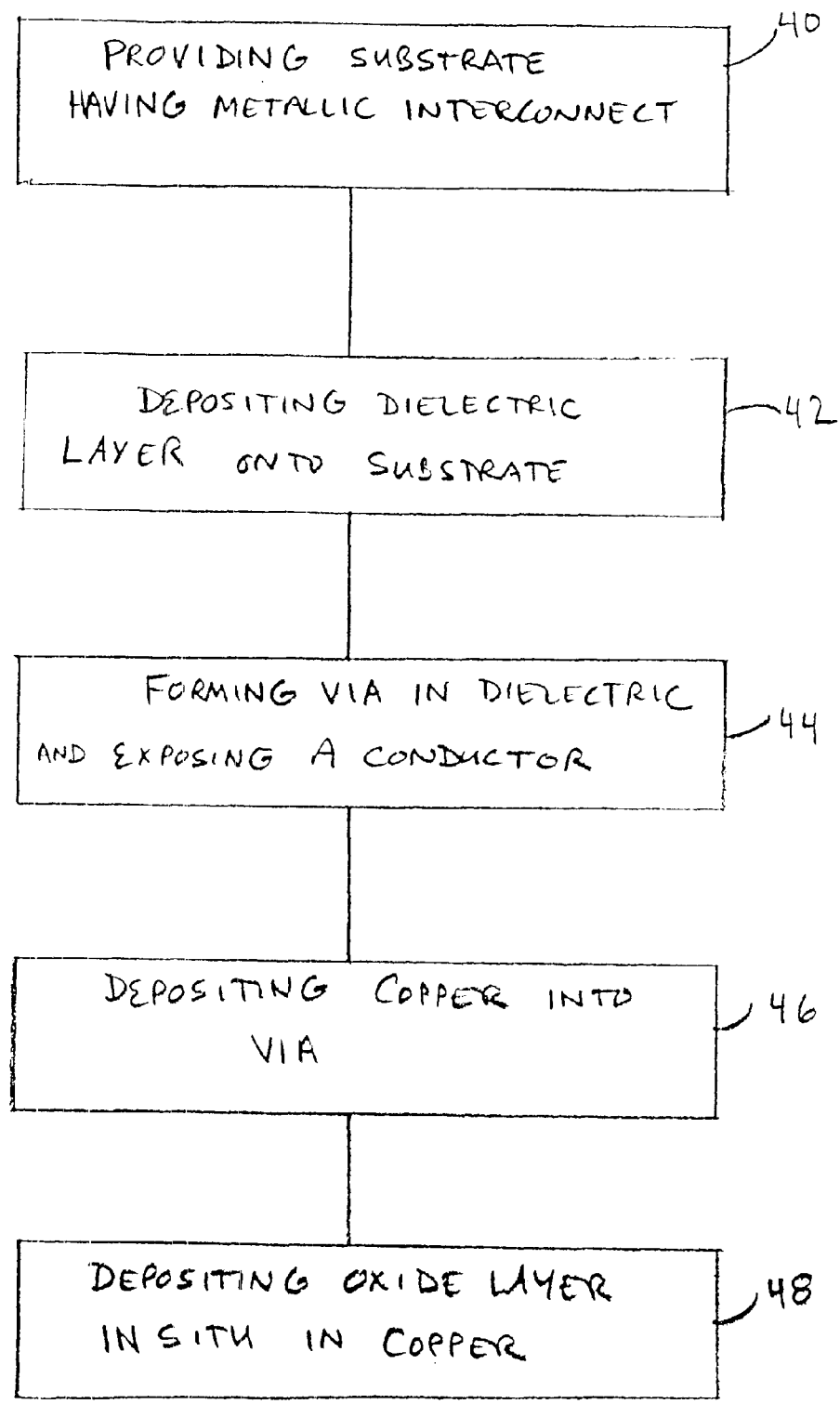
FIG. 4 is a flow chart illustrating the steps in one method of the present invention.

FIG. 4 is a flow chart outlining one preferred process of the present invention. In step 40, a substrate is provided with a dielectric material deposited thereon in step 42. In step 44a, via is photolithographically or otherwise fashioned into the dielectric exposing a conductor. Copper is deposited in the via, preferably by via CVD in step 46, and an oxide layer is deposited in situ within the copper layer in step 48. Additional copper is then deposited over the oxide layer if desired.

In one preferred embodiment, the oxide deposited in situ in the copper surface is produced electrochemically using alkaline chloride. First the copper is introduced to the vias by electroplating. Then at a predetermined time, the electrodeposition of the protective oxide is conducted over the copper. Lastly, the remainder of the copper deposition is completed over the oxide layer. The oxide can be delivered to any predetermined thickness but is preferably deposited to a thickness of from about 50 Å to about 700 Å, more preferably from about 50 Å to about 200 Å, and most preferably about 100 Å. The oxide layer acts as a corrosion inhibitor and is removed if desired, prior to integrated circuit use. The oxide layer is thus embedded within the copper metal and stays intact until before the barrier metal deposition step of the subsequent metal level where it is removed. Typically, in a multilevel interconnect scheme, this protective oxide layer remains intact through the CMP process until before the subsequent metallization is done. When the subsequent metallization is conducted, this protective oxide layer is removed either by dry sputter etch or wet chemical etch prior to the barrier metal deposition step. This is necessary to maintain a conducting interconnect scheme. In the case of the final interconnect being copper, the protective oxide may not be removed except in specific metal probe locations.

According to the present invention, a more uniform oxide surface layer is achieved by depositing the oxide layer uniformly in situ within the copper layer. In addition, the deposition of the oxide layer in situ allows the deposition of this necessary layer to occur simultaneously with the copper depositing step thus obviating the need to set up a time-consuming additional oxide material deposition step after copper deposition. It is understood that the interconnects and semiconductors of the present invention may be used in any type of electrical device using integrated circuits and semiconductors.

The in-situ oxidation is preferably effected by treating the interconnect in an acidic electrochemical bath with sodium peroxy disulfate ($Na_2S_2O_8$). The acidic bath is preferably maintained at a pH of from about 2 to about 6. The reaction as shown below (I) results in the liberation of sulfate ions and hydrogen peroxide. The highly reactive and oxidative peroxide generated in situ in its nascent form provides the required controllable oxidation to effect the required oxidative layer in situ.

$$Na_2S_2O_8 + H^+ \rightarrow 2SO_4^{-2} + H_2O_2 \qquad (I)$$

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method of forming a semiconductor providing the steps of:

providing a substrate having a metallic conductor;

depositing a dielectric layer onto the substrate;

forming a via through the dielectric layer and exposing the metallic conductor;

depositing copper having an oxide layer formed in situ into the via; and forming an oxide layer in situ in the copper.

2. The method of claim 1, further comprising the step of depositing an additional amount of copper on the oxide layer.

3. The method of claim 1, further comprising depositing at least one barrier layer into the via between the dielectric and the copper.

4. The method of claim 3, wherein the barrier layer is made from a material selected from the group consisting of tantalum nitride, titanium nitride, titanium tungsten, tantalum, titanium, tantalum silicon nitride, tungsten nitride, and combinations thereof.

5. The method of claim 3, further comprising depositing a copper-containing intermediate layer onto the barrier layer.

6. The method of claim 5, wherein the copper is deposited onto the copper-containing intermediate layer.

7. The method of claim 5, wherein the copper-containing intermediate layer is deposited to a thickness of from about 1000 Å to about 3000 Å.

8. The method of claim 1, wherein the step of forming the oxide layer in situ further comprises adding an amount of $Na_2S_2O_8$ in an acidic medium.

9. The method of claim 1, wherein the copper is deposited by chemical vapor deposition.

* * * * *